United States Patent
Fujii

(10) Patent No.: US 7,165,560 B2
(45) Date of Patent: Jan. 23, 2007

(54) ETCHING METHOD, ETCHING APPARATUS, AND METHOD FOR MANUFACTURING SEMICONDUCTOR DEVICE

(75) Inventor: Shinji Fujii, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 2 days.

(21) Appl. No.: 10/490,049

(22) PCT Filed: Jun. 5, 2003

(86) PCT No.: PCT/JP03/07163

§ 371 (c)(1),
(2), (4) Date: Mar. 19, 2004

(87) PCT Pub. No.: WO2004/075277

PCT Pub. Date: Sep. 2, 2004

(65) Prior Publication Data

US 2005/0029230 A1    Feb. 10, 2005

(30) Foreign Application Priority Data

Feb. 20, 2003   (JP) .............................. 2003-042679

(51) Int. Cl.
  *B08B 6/00*  (2006.01)
  *H01L 21/302*  (2006.01)
(52) U.S. Cl. ............................ 134/1.3; 438/8; 438/16; 438/17; 438/745; 216/84; 216/85; 216/86

(58) Field of Classification Search ................ 438/8, 438/16, 17, 745; 216/84, 85, 86; 134/1.3
See application file for complete search history.

(56) References Cited

U.S. PATENT DOCUMENTS

| 4,871,417 | A | * | 10/1989 | Nishizawa et al. | ......... 438/748 |
| 6,020,243 | A | * | 2/2000 | Wallace et al. | ............. 438/287 |
| 6,037,270 | A | * | 3/2000 | Kageyama et al. | ......... 438/746 |
| 6,146,467 | A | * | 11/2000 | Takaishi et al. | ................ 134/3 |
| 6,667,246 | B2 | * | 12/2003 | Mitsuhashi et al. | ......... 438/756 |
| 6,848,455 | B1 | * | 2/2005 | Shrinivasan et al. | ......... 134/1.3 |
| 2003/0148627 | A1 | * | 8/2003 | Aoki et al. | .................. 438/749 |
| 2004/0102009 | A1 | * | 5/2004 | Quevedo-Lopez et al. | .. 438/287 |

FOREIGN PATENT DOCUMENTS

| EP | 252439 A2 | | 1/1988 |
| EP | 690484 A1 | | 1/1996 |
| JP | 03-042814 | * | 2/1991 |
| JP | 05-211223 | * | 8/1993 |
| JP | 08-031781 | * | 2/1996 |
| JP | 08-160032 | * | 6/1996 |

(Continued)

OTHER PUBLICATIONS

Definitions of the term stoichiometric on the web as obtained from Google search engine on mar. 24, 2006.*

*Primary Examiner*—George A. Goudreau
(74) *Attorney, Agent, or Firm*—McDermott, Will & Emery LLP

(57) ABSTRACT

In order to reliably remove, by wet etching, a compound containing a metal and silicon, e.g., a silicate (101a) containing hafnium metal, the silicate (101a) is oxidized and then the oxidized silicate (101a) is wet-etched.

19 Claims, 4 Drawing Sheets

FOREIGN PATENT DOCUMENTS

| | | | |
|---|---|---|---|
| JP | 09-171996 | * | 6/1997 |
| JP | 9-312275 | | 12/1997 |
| JP | 10-199847 | * | 7/1998 |
| JP | 11-354481 | * | 12/1999 |
| JP | 2000-49349 A | | 2/2000 |
| JP | 2003-037099 | * | 2/2003 |
| JP | 2003-37099 A | | 2/2003 |
| JP | 2003-229401 A | | 8/2003 |
| JP | 2003-234325 A | | 8/2003 |
| WO | WO 2004/075277 A1 | | 9/2004 |

* cited by examiner (a)

(b)

(c)

(d)

| | Process performed for sample | Hf 4f 7/2 peak position |
|---|---|---|
| a | Unprocessed | 17.32eV |
| b | UV light irradiation (60 sec) | 17.84eV |
| c | $O_3$ water treatment (60 sec) | 17.70eV |
| d | 2.5%-DHF cleaning (30 sec) | 17.09eV |

FIG. 6
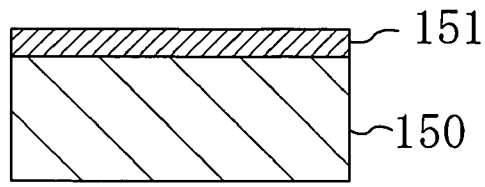
FIG. 7
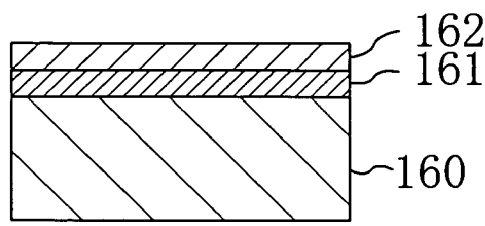
FIG. 8
| Sample name | Detected element and amount thereof | |
|---|---|---|
| $HfO_2$-1 | Zr | 82 |
|  | Na | 260 |
|  | K | 70 |
|  | Fe | 76 |
|  | Ni | 19 |
| $HfO_2$-2 | Zr | 42 |
|  | Na | 40 |
|  | K | 7 |
Unit for amount detected : $\times 10^{10}$ atoms/cm$^2$

ETCHING METHOD, ETCHING APPARATUS, AND METHOD FOR MANUFACTURING SEMICONDUCTOR DEVICE

TECHNICAL FIELD

The present invention relates to a method and apparatus for removing, by wet etching, a compound containing a metal such as hafnium and silicon, and a method for manufacturing a semiconductor device using the same.

BACKGROUND ART

In recent years, it has been proposed in the art to use a high dielectric constant material (hereinafter referred to as a "high-k material") in the gate insulating film of a field-effect transistor in order to prevent the decrease in the driving current while suppressing the increase in the gate current. Specifically, it has been proposed in the art to use hafnium oxide ($HfO_2$: relative dielectric constant $\in=30$), zirconium oxide. ($ZrO_2$: relative dielectric constant $\in=25$), or the like, as the material of the gate insulating film so as to maintain a desired thickness of the gate insulating film, thereby reducing the leak current (see, for example, Japanese Laid-Open Patent Publication No. 2000-49349).

When hafnium oxide, for example, is used as the material of the gate insulating film, a silicate (hafnium silicon oxide) is formed at the interface between the silicon substrate and the gate insulating film. Specifically, when a heat treatment is performed after a gate insulating film made of a high-k material such as hafnium oxide or zirconium oxide is formed on a silicon substrate, the gate insulating film reacts with the underlying silicon substrate, whereby an insufficiently-oxidized silicate, which is a compound between the material of the gate insulating film and silicon, is formed near the surface of the silicon substrate. Where a hafnium oxide film is used as the gate insulating film, insufficiently-oxidized hafnium silicon oxide is formed as the silicate. Moreover, where a zirconium oxide film is used as the gate insulating film, insufficiently-oxidized zirconium silicon oxide is formed as the silicate.

Wet etching using an aqueous hydrogen fluoride solution is suitable for etching away a hafnium oxide film, a zirconium oxide film, or the like, as with a silicon oxide film. This is because an aqueous hydrogen fluoride solution does not substantially etch the silicon substrate.

However, it is difficult to remove a silicate such as hafnium silicon oxide or zirconium silicon oxide by a wet etching method using hydrogen fluoride, or the like. Specifically, the etching rate of wet etching using hydrogen fluoride, or the like, for hafnium silicon oxide or zirconium silicon oxide is about 1/10 to 1/30 that for hafnium oxide or zirconium oxide. Thus, when an insulative metal oxide film such as a hafnium oxide film is used as the gate insulating film, an insufficiently-oxidized silicate layer such as a hafnium silicon oxide film is formed at the interface between the silicon substrate and the gate insulating film, and it is difficult to remove the silicate layer by a wet etching method using hydrogen fluoride, or the like. As a result, the unremoved silicate remains on the surface of the silicon substrate when forming the gate electrode structure. Thus, a plurality of minute field-effect transistors, which are supposed to be electrically separated from one another, are electrically shorted with one another. Moreover, through a heat treatment step after the formation of the gate electrode structure, the silicate remaining on the surface of the silicon substrate is implanted into the silicon substrate as an impurity, thereby forming a level due to the impurity, which adversely influences the semiconductor substrate.

DISCLOSURE OF THE INVENTION

In view of the above, it is an object of the present invention to make it possible to reliably remove, by wet etching, a compound containing at least a metal and silicon, specifically, an insufficiently-oxidized silicate containing a hafnium metal, a zirconium metal, or the like.

In order to achieve the object set forth above, an etching method of the present invention includes: a first step of oxidizing a compound containing at least a metal and silicon; and a second step of removing the oxidized compound by wet etching.

With the etching method of the present invention an insufficiently-oxidized compound containing a metal and silicon is oxidized, whereby the composition of the compound can be brought closer to the stoichiometric composition of the metal oxide. Therefore, the insufficiently-oxidized compound, which is normally insoluble in an etching liquid (hereinafter referred to as an "etchant") such as an aqueous hydrogen fluoride solution, is oxidized, and becomes more soluble in the etchant, whereby it is possible to reliably remove the compound by wet etching.

In the etching method of the present invention, if the metal to be etched is hafnium or zirconium, the composition of the oxidized compound is closer to the stoichiometric composition of hafnium oxide ($HfO_2$) or zirconium oxide ($ZrO_2$), whereby it is possible to reliably remove the oxidized compound by wet etching using hydrogen fluoride, or the like.

In the etching method of the present invention, if the compound to be etched is an oxygen-containing (insufficiently-oxidized) silicate compound, the composition of the silicate compound is brought even closer to the stoichiometric composition of the metal oxide by the oxidization, whereby it is possible to reliably remove the oxidized silicate compound by wet etching using hydrogen fluoride, or the like.

In the etching method of the present invention, if the compound to be etched is an intermetallic compound (e.g., a silicide), the composition of the oxidized intermetallic compound is brought closer to the stoichiometric composition of the metal oxide, whereby it is possible to reliably remove the oxidized intermetallic compound by wet etching using hydrogen fluoride, or the like.

In the etching method of the present invention, it is preferred that the first step includes a step of irradiating the compound with ultraviolet light in an oxygen-containing atmosphere.

In this way, ozone is generated by the ultraviolet light irradiation, whereby the compound can reliably be oxidized by the ozone, starting from its surface side.

Moreover, in this case, it is preferred that the ultraviolet light irradiation is performed while supplying a nitrogen gas into the atmosphere.

In this way, it is possible to suppress the attenuation of ultraviolet light in the atmosphere, whereby ozone can reliably be generated by the ultraviolet light irradiation. Moreover, similar effects can be obtained by using another inert gas, instead of a nitrogen gas.

In the etching method of the present invention, it is preferred that a step of irradiating the compound with ultraviolet light while an oxygen-containing liquid (e.g., water) is attached to a surface of the compound is included.

In this way, ozone is generated by the ultraviolet light irradiation, whereby the compound can reliably be oxidized by the ozone, starting from its surface side.

In the etching method of the present invention, it is preferred that the first step includes a step of exposing the compound to an ozone-containing solution.

In this way, the compound can reliably be oxidized, starting from its surface side.

In the etching method of the present invention, it is preferred that a solution containing fluorine and hydrogen is used as an etchant in the second step.

In this way, it is possible to reliably remove the oxidized compound by wet etching using a solution containing fluorine and hydrogen, specifically, an aqueous hydrogen fluoride solution.

Moreover, in this case, the solution containing fluorine and hydrogen may be supplied in a gaseous state.

In the etching method of the present invention, it is preferred that the metal is hafnium or zirconium; and a solution containing fluorine and hydrogen is used as an etchant in the second step.

In this way, by oxidizing an insufficiently-oxidized compound, the composition of the compound is brought closer to the stoichiometric composition of hafnium oxide ($HfO_2$) or zirconium oxide ($ZrO_2$), whereby it is possible to reliably remove the oxidized compound by wet etching using a solution containing fluorine and hydrogen, specifically, hydrogen fluoride.

In the etching method of the present invention, if the compound is formed on a silicon region; and the second step includes a step of removing the oxidized compound, thereby exposing the silicon region, the following effect is obtained.

That is, since the oxidized compound is easily dissolved in a solution such as hydrogen fluoride, for example, while the silicon region is not easily dissolved in the solution, whereby the oxidized compound can be selectively removed by wet etching. Thus, a clean silicon region surface can be exposed. Moreover, the etching process can reliably be stopped at the surface of the silicon region.

Note that in the etching method of the present invention, a set of steps including the first step and the second step may be performed repeatedly, or the first step and the second step may be performed simultaneously.

A first etching apparatus of the present invention includes: a table on which an etching object is placed; a light source for irradiating the etching object placed on the table with ultraviolet light; and a solution supply section for supplying an etchant to the etching object placed on the table.

With the first etching apparatus, in a case where the etching object is a compound containing a metal and silicon, ultraviolet light is radiated from the light source toward the etching object in an oxygen-containing atmosphere, whereby ozone is generated, and the ozone oxidizes the etching object. In this way, the composition of the insufficiently-oxidized etching object can be brought closer to the stoichiometric composition of the metal oxide, whereby it is possible to reliably remove the etching object by supplying an etchant such as hydrogen fluoride, for example, from the solution supply section to the etching object.

In the first etching apparatus, if the apparatus further includes a rotating mechanism for spinning the table, it is possible to uniformly supply the etchant to the etching object.

In the first etching apparatus, if the apparatus further includes a gas supply section for supplying a nitrogen gas to the etching object placed on the table, it is possible to suppress the attenuation of ultraviolet light, whereby ozone can reliably be generated by the ultraviolet light irradiation. Moreover, similar effects can be obtained with a gas supply section supplying another inert gas, instead of a nitrogen gas.

A second etching apparatus of the present invention includes: a table on which an etching object is placed; a first solution supply section for supplying an ozone-containing solution to the etching object placed on the table; and a second solution supply section for supplying an etchant to the etching object placed on the table.

With the second etching apparatus, in a case where the etching object is a compound containing a metal and silicon, an ozone-containing solution is supplied to the etching object from the first solution supply section, whereby the solution oxidizes the etching object. Therefore, the composition of the insufficiently-oxidized etching object can be brought closer to the stoichiometric composition of the metal oxide, whereby it is possible to reliably remove the etching object by supplying an etchant such as hydrogen fluoride, for example, from the second solution supply section to the etching object.

In the second etching apparatus, if the apparatus further includes a rotating mechanism for spinning the table, it is possible to uniformly supply the etchant to the etching object.

In the second etching apparatus, the apparatus may further include a light source for irradiating the etching object placed on the table with ultraviolet light.

A method for manufacturing a semiconductor device of the present invention includes: a step of forming a gate insulating film on a silicon region; a step of forming a conductive film on the gate insulating film; a step of forming a gate electrode by dry-etching the conductive film using a mask that covers a gate electrode formation region; and a step of removing a portion of the gate insulating film outside the gate electrode by wet etching. Moreover, the gate insulating film includes an insulating layer made of a compound containing a metal, silicon and oxygen. Furthermore, the step of removing the gate insulating film includes a step of oxidizing the insulating layer and then removing the oxidized insulating layer by wet etching.

With the method for manufacturing a semiconductor device of the present invention, a gate insulating film having an insulating layer made of a compound containing a metal, silicon and oxygen, i.e., a silicate layer, is etched by oxidizing the insufficiently-oxidized silicate layer and then wet-etching the oxidized silicate layer. In this process, the composition of the oxidized silicate layer is brought closer to the stoichiometric composition of the metal oxide, whereby the silicate layer becomes more soluble in an etchant such as an aqueous hydrogen fluoride solution, for example. Thus, it is possible to reliably remove the silicate layer by wet etching. Therefore, it is possible to prevent a situation where impurities remain between gate electrode structures, thereby improving the production yield in the manufacture of a semiconductor device.

Moreover, with the method for manufacturing a semiconductor device of the present invention, in a case where an aqueous hydrogen fluoride solution is used as an etchant, the aqueous hydrogen fluoride solution does not substantially etch the silicon region (e.g., a silicon substrate) underlying the gate insulating film, whereby it is possible to selectively etch a silicate containing hafnium, for example.

In the method for manufacturing a semiconductor device of the present invention, it is preferred that the metal is hafnium or zirconium; and a solution containing fluorine and hydrogen is used as an etchant in the step of removing the insulating layer.

In this way, the composition of the oxidized insulating layer is brought closer to the stoichiometric composition of hafnium oxide or zirconium oxide, whereby the insulating layer can reliably be removed by wet etching using a solution containing fluorine and hydrogen, specifically, hydrogen fluoride.

In the method for manufacturing a semiconductor device of the present invention, the gate insulating film may further include an oxide film formed on the insulating layer and made of an oxide of a metal of the same kind as the metal; and the step of removing the gate insulating film may include a step of removing a portion of the oxide film outside the gate electrode by wet etching before oxidizing the insulating layer. It may not be necessary to wait for the insulating layer to be exposed before performing the etching method of the present invention, i.e., before performing the set of processes including the oxidization process and the etching process, to remove the insulating layer. In other words, the set of processes may be initiated to remove the oxide film when the conductive film for forming the gate electrode is removed and the oxide film is exposed.

A first compound analysis method of the present invention includes: a step of oxidizing a compound containing at least a metal and silicon; a step of removing the oxidized compound by wet etching while collecting a used etchant; and a step of analyzing the collected etchant to identify an impurity contained in the compound.

Thus, the first compound analysis method is a compound analysis method using the etching method of the present invention. Specifically, the compound analysis is performed by performing the etching method of the present invention on a compound containing a metal and silicon and then collecting and analyzing the used etchant. Therefore, it is possible to reliably remove a silicate compound, or the like, which is difficult to remove by a conventional wet etching process, and it is possible to easily identify the impurities contained in the compound simply by analyzing the collected etchant.

A second compound analysis method of the present invention includes: a first etching step of removing a first layered film by wet etching while collecting a used etchant, the first layered film including a lower-layer film made of a compound containing a metal, silicon and oxygen and an upper-layer film formed on the lower-layer film and made of an oxide of a metal of the same kind as the metal; a first analysis step of analyzing the etchant collected in the first etching step to identify an impurity contained in the first layered film; a second etching step of removing an upper-layer film of a second layered film having the same structure as that of the first layered film by wet etching while collecting a used etchant; a second analysis step of analyzing the etchant collected in the second etching step to identify an impurity contained in the upper-layer film in the second layered film; and a third analysis step of comparing an analysis result from the first analysis step and an analysis result from the second analysis step with each other to identify an impurity contained in the lower-layer film. Moreover, the first etching step includes a step of oxidizing the lower-layer film in the first layered film and then removing the oxidized lower-layer film by wet etching.

Thus, the second compound analysis method is a compound analysis method using the etching method of the present invention. Specifically, in a case where the first layered film is removed by wet etching, the etching method of the present invention is performed on the lower-layer film in the first layered film, i.e., the layer of a compound containing a metal, silicon and oxygen. Therefore, it is possible to reliably remove the first layered film including the lower-layer film by wet etching, whereby it is possible to easily identify the impurities contained in the first layered film simply by analyzing the collected etchant. Moreover, impurities contained in the upper-layer film are identified separately by using the second layered film having the same structure as that of the first layered film. Therefore, by comparing the identification results with those for the impurities in the first layered film, it is possible to indirectly identify the impurities in the lower-layer film, without directly identifying the impurities contained in the lower-layer film.

BRIEF DESCRIPTION OF THE DRAWINGS

FIG. 6 is a diagram illustrating an example of a cross section of a substrate to which the compound analysis method according to the second embodiment of the present invention is applied.

FIG. 7 is a diagram illustrating an example of a cross section of a substrate to which the compound analysis method according to a variation of the second embodiment of the present invention is applied.

FIG. 8 shows the analysis results by the compound analysis method according to the variation of the second embodiment of the present invention.

BEST MODE FOR CARRYING OUT THE INVENTION

First Embodiment

A method for manufacturing a semiconductor device according to the first embodiment of the present invention, specifically, a method for manufacturing a field-effect transistor using a hafnium oxide film as the gate insulating film, will now be described with reference to the drawings.

FIG. 1(a) to FIG. 1(d) are cross-sectional views illustrating steps of the method for manufacturing a semiconductor device according to the first embodiment.

Figure 1:
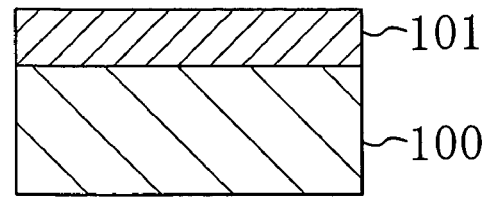
FIG. 1(a) to FIG. 1(d) are cross-sectional views illustrating steps of a method for manufacturing a semiconductor device according to the first embodiment of the present invention.
Figure 1:
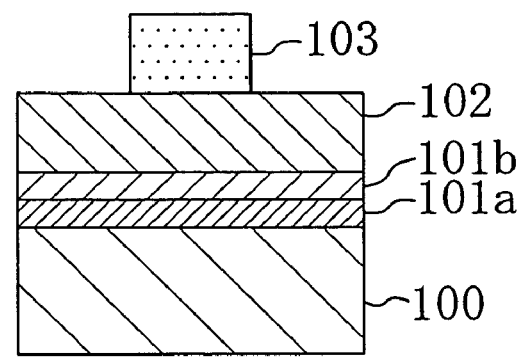
Figure 1:
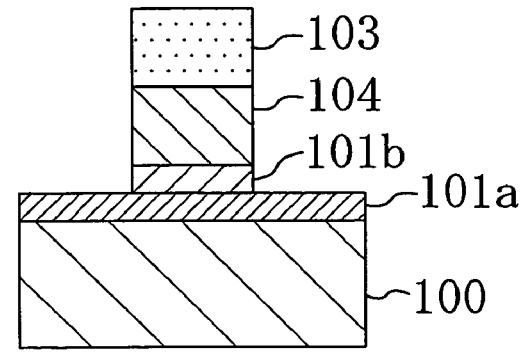
Figure 1:
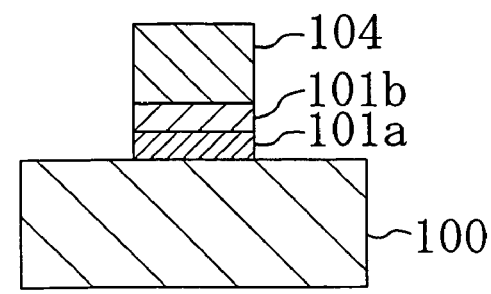

First, as illustrated in FIG. 1(a), a hafnium oxide film 101 having a thickness of about 10 nm is formed on a substrate 100 made of silicon, for example, by a CVD (chemical vapor deposition) method or a sputtering method, for example. In this process, the hafnium oxide film 101 may be formed on a silicon substrate whose surface has been treated with nitrogen.

Then, as illustrated in FIG. 1(b), a polysilicon film 102 to be the gate electrode material having a thickness of about 200 nm is deposited on the hafnium oxide film 101 by, for example, a low-pressure CVD method using a silane gas. In this process, the hafnium oxide film 101 reacts with the silicon layer on the surface of the substrate 100 due to the high temperature during the deposition of the polysilicon film 102, whereby a hafnium silicate ($HfSi_xO_y$: x>0, y>0), specifically, a hafnium silicon oxide film 101a, is formed. Note that not all of the hafnium oxide film 101 is turned into the hafnium silicon oxide film 101a, but the hafnium silicon oxide film 101a having a thickness dependent on the thickness of the deposited hafnium oxide film 101 is formed near the surface of the substrate 100. In the following description, the portion of the hafnium oxide film 101 that is not turned into the hafnium silicon oxide film 101a will be referred to as a hafnium oxide film 101b. Thus, in the present embodiment, the gate insulating film has a layered structure including the hafnium oxide film 101b and the hafnium silicon oxide film 101a. Note that where the hafnium oxide film 101 is formed after nitriding the surface of the substrate 100, i.e., a silicon substrate, a hafnium nitride silicon oxide film, instead of the hafnium silicon oxide film 101a, is formed near the surface of the substrate 100.

Then, a resist pattern 103 for forming the gate electrode structure is formed on the polysilicon film 102, as illustrated in FIG. 1(b), after which the polysilicon film 102 is patterned by dry etching using a chlorine gas, for example, while using the resist pattern 103 as a mask, as illustrated in FIG. 1(c). Thus, a gate electrode 104 made of the polysilicon film 102 is formed. The dry etching process is stopped at a certain point in the gate insulating film having a layered structure including the hafnium oxide film 101b and the hafnium silicon oxide film 101a, specifically, when the hafnium oxide film 101b is removed and the hafnium silicon oxide film 101a is exposed in a portion of the gate insulating film outside the gate electrode 104.

Note that in the present embodiment, the dry etching process illustrated in FIG. 1(c) may be stopped when the polysilicon film 102 is removed and the hafnium oxide film 101b is exposed, may be stopped when the hafnium oxide film 101b is partially removed, or may be stopped when the hafnium oxide film 101b is removed and the hafnium silicon oxide film 101a is partially removed. Note however that the etching process must be stopped before the substrate 100 is exposed. This is because when the substrate 100, i.e.; a silicon substrate, is exposed to a chlorine gas, which is the etching gas, the silicon substrate is etched significantly by the chlorine gas.

Then, as illustrated in FIG. 1(d), the resist pattern 103 is removed by ashing, after which a portion of the hafnium silicon oxide film 101a outside the gate electrode 104 is removed and a portion of the substrate 100 outside the gate electrode 104 is exposed by wet etching using an aqueous hydrogen fluoride solution, for example. Thus, a gate electrode structure is produced. Note that the wet etching step illustrated in FIG. 1(d) will later be described in detail.

Finally, although not shown in the figures, a source region and a drain region are formed in the substrate 100 by using an ion implantation method, for example, thereby completing a field-effect transistor in which a hafnium oxide film, being a high-k material film, is used as the gate insulating film.

A method for removing a hafnium silicon oxide film by wet etching using an aqueous hydrogen fluoride solution, as illustrated in FIG. 1(d), will now be described in detail.

Figure 2:
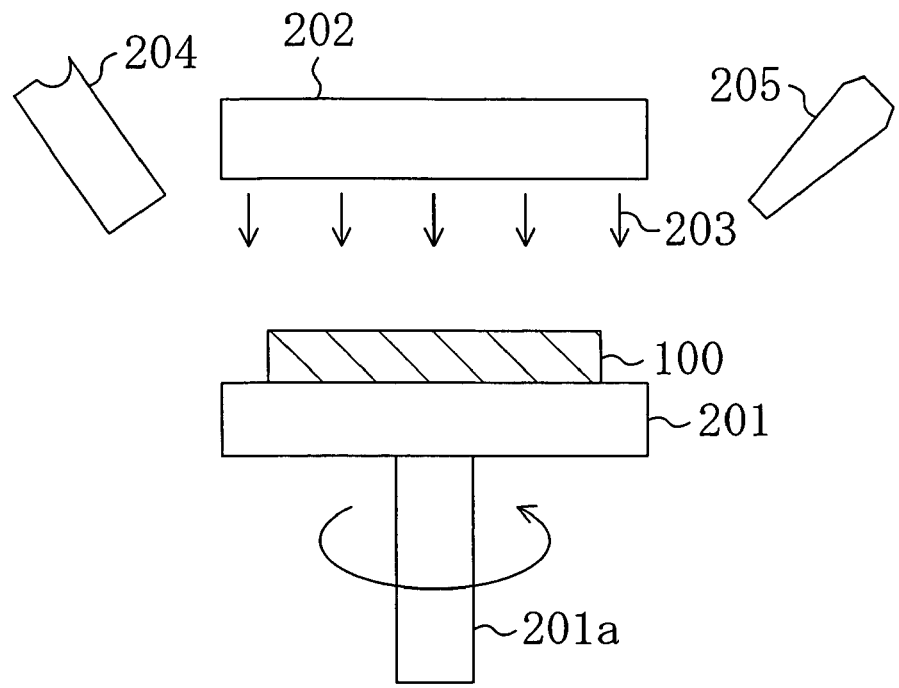
FIG. 2 is a schematic diagram illustrating a configuration of an etching apparatus according to the first embodiment of the present invention.

FIG. 2 is a schematic diagram illustrating a configuration of an etching apparatus of the present embodiment, specifically, a wet etching apparatus including an ultraviolet light radiation mechanism.

As illustrated in FIG. 2, the substrate 100 is placed on a substrate table 201. Note that the hafnium silicon oxide film 101a, or the like, being an etching object on the substrate 100 is not shown in the figure. A rotating shaft (rotating mechanism) 201a for spinning the substrate table 201 is attached to the lower surface of the substrate table 201, whereby the substrate 100 can be spun together with the substrate table 201. Moreover, an excimer lamp 202 is provided above the substrate 100 placed on the substrate table 201 as an ultraviolet light source (illumination mechanism). The excimer lamp 202 radiates xenon excimer (Xe Excimer) light 203 having a wavelength of 172 nm. Note that while a lamp that radiates light having a different wavelength, such as $F_2$ laser, may be used instead of the excimer lamp 202, the excimer lamp 202 radiating the xenon excimer light 203 having a wavelength of 172 nm is used in the present embodiment in view of the efficiency at which ozone is generated by the ultraviolet light irradiation and the transmissivity of the lamp light through the atmosphere.

Moreover, as illustrated in FIG. 2, the etching apparatus of the present embodiment includes a gas supply section 204 capable of supplying an inert gas such as a nitrogen gas, for example, into the space between the substrate 100 on the substrate table 201 and the excimer lamp 202, and also includes a chemical liquid supply section 205 capable of supplying an etchant (chemical liquid) onto the substrate 100 on the substrate table 201. Note that the wet etching apparatus of the present embodiment is an apparatus of a so-called "single wafer process" type that processes one wafer to be the substrate 100 at a time.

Next, oxidation of the hafnium silicon oxide film by ultraviolet light (UV light) radiated from the excimer lamp 202 will be described. As described above with reference to FIG. 1(c), at the time when the gate electrode material (the polysilicon film 102) is patterned by dry etching into the gate electrode 104, the hafnium silicon oxide film 101a, i.e., a hafnium silicate ($HfSi_xO_y$: x>0, y>0), is exposed on the surface of the substrate 100 near the gate electrode 104. As described above in "Problems to be Solved by the Invention", it is difficult to remove the insufficiently-oxidized hafnium silicon oxide film 101a by wet etching using a solution of hydrogen fluoride, or the like.

In view of this, in the present embodiment, the xenon excimer light 203, which is ultraviolet light, is radiated from the excimer lamp 202 toward the substrate 100 in an oxygen-containing atmosphere by using the etching apparatus illustrated in FIG. 2. Thus, ozone is generated in the atmosphere, and an insufficiently-oxidized hafnium silicate (the hafnium silicon oxide film 101a) on the substrate 100 is oxidized by the ozone, starting from its surface side. In this process, similar effects can be obtained by using ultraviolet light other than the xenon excimer light 203.

Moreover, when radiating the xenon excimer light 203 in the present embodiment, a nitrogen gas, for example, is supplied from the gas supply section 204 into the space between the substrate 100 on the substrate table 201 and the excimer lamp 202 in order to suppress the attenuation of the xenon excimer light 203, i.e., ultraviolet light, in the space. Note that the 50% attenuation length of the xenon excimer light 203 having a wavelength of 172 nm in the air is 5 mm. Moreover, the supply of a nitrogen gas from the gas supply section 204 is provided so that the space between the substrate 100 on the substrate table 201 and the excimer lamp 202 is not filled solely with the nitrogen gas, or in other words so that oxygen atoms, which are the source of ozone, are not all eliminated from the space. Note that the minimum oxygen concentration required for ozone generation is on the order of ppm.

Specifically, in the wet etching step illustrated in FIG. 1(d), i.e., the etching step of the present embodiment, first, the xenon excimer light 203 (UV light) is radiated from the excimer lamp 202 toward the substrate 100 on the substrate table 201 for about 60 seconds while supplying a nitrogen gas from the gas supply section 204. Then, an aqueous hydrogen fluoride solution, for example, is supplied from the chemical liquid supply section 205 toward the substrate 100 on the substrate table 201, thereby wet-etching the hafnium silicate (specifically, a portion of the hafnium silicon oxide film 101a outside the gate electrode 104). In this process, the aqueous hydrogen fluoride solution can be supplied uniformly onto the substrate 100 by spinning the substrate 100 together with the substrate table 201 by the rotating shaft 201a.

In this way, the hafnium silicate, which is normally insoluble in an aqueous hydrogen fluoride solution, becomes soluble in an aqueous hydrogen fluoride solution by the UV light irradiation. This is for the following reason. That is, oxygen in the atmosphere is turned into ozone by the UV light irradiation, and a surface portion of the insufficiently-oxidized hafnium silicate is oxidized by the ozone. As a result, the surface portion of the hafnium silicate takes a stoichiometric composition close to that of hafnium oxide, whereby the surface portion is dissolved in the aqueous hydrogen fluoride solution.

Note that in a case where the hafnium silicate film has such a large thickness that the film cannot entirely be removed by a single iteration of the UV light irradiation and the hydrogen fluoride treatment, the set of processes including the UV light irradiation and the hydrogen fluoride treatment is repeated for the film. Specifically, the insufficiently-oxidized hafnium silicate on the substrate is oxidized by the UV light irradiation, and then the oxidized hafnium silicate is removed by the hydrogen fluoride treatment. Then, after hydrogen fluoride remaining on the substrate is washed away with pure water, the surface condition of the substrate is measured by, for example, confirming the water repellency of the substrate. If it is confirmed that the surface of the substrate (silicon substrate) is not exposed, the second set of the UV light irradiation and the hydrogen fluoride treatment is performed for the hafnium silicate remaining on the substrate, thus removing the newly-oxidized hafnium silicate. Then, after hydrogen fluoride remaining on the substrate is washed away with pure water, the surface condition of the substrate is measured again. Thus, the set of processes is repeated until it is confirmed by the measurement that the substrate surface is exposed, specifically, until the water repellency of the substrate surface is confirmed. In such a case, in order to improve the throughput in the manufacture of a semiconductor device, it is preferred that the washing with pure water and the measurement of the substrate surface condition can be performed in the same apparatus that performs the UV light irradiation and the hydrogen fluoride treatment (e.g., the etching apparatus illustrated in FIG. 2).

As described above, according to the present embodiment, the process of etching the gate insulating film having the hafnium silicon oxide film (silicate layer) 101a is performed by oxidizing the insufficiently-oxidized hafnium silicon oxide film 101a and then wet-etching the oxidized hafnium silicon oxide film 101a. In this process, the composition of the oxidized hafnium silicon oxide film 101a comes closer to the stoichiometric composition of hafnium oxide. Thus, the oxidized hafnium silicon oxide film 101a becomes more soluble in an etchant such as an aqueous hydrogen fluoride solution, for example. Therefore, it is possible to reliably remove the oxidized hafnium silicon oxide film 101a by wet etching, and to prevent a situation where impurities remain between gate electrode structures, thereby improving the production yield in the manufacture of a semiconductor device.

Moreover, according to the first embodiment, an aqueous hydrogen fluoride solution that does not substantially etch the substrate (silicon substrate) 100 underlying the gate insulating film is used as the etchant, whereby the oxidized hafnium silicon oxide film 101a can be removed selectively by wet etching.

Moreover, according to the first embodiment, the xenon excimer light 203, which is ultraviolet light, is radiated from the excimer lamp 202 toward the substrate 100 in an oxygen-containing atmosphere by using the etching apparatus illustrated in FIG. 2. Therefore, it is possible to reliably oxidize the hafnium silicon oxide film 101a on the substrate 100 by the ozone generated in the atmosphere. Moreover, the oxidization of the hafnium silicon oxide film 101a is performed in a gaseous phase. Therefore, even if the wafer to be the substrate 100 has surface irregularities, the hafnium silicon oxide film 101a can be oxidized more uniformly, as compared with wet oxidization. Specifically, even if the wafer has minute surface irregularities, the hafnium silicon oxide film 111a can be etched uniformly by performing the hydrogen fluoride treatment after it is irradiated with the xenon excimer light 203, i.e., UV light, thereby improving the production yield in the manufacture of a semiconductor device.

Note that in the first embodiment, when the hafnium silicon oxide film 101a is removed by wet etching, the UV light irradiation and the hydrogen fluoride treatment are performed separately. Alternatively, the UV light irradiation and the hydrogen fluoride treatment may be performed together. Specifically, an aqueous hydrogen fluoride solution is supplied from the chemical liquid supply section 205 onto the substrate 100 while supplying a nitrogen gas from the gas supply section 204 into the space between the substrate 100 on the substrate table 201 and the excimer lamp 202, by using the etching apparatus illustrated in FIG. 2. In this process, the xenon excimer light 203 is radiated from the excimer lamp 202 toward the substrate 100 at the same time. In this way, a portion of the insufficiently-oxidized hafnium silicon oxide film 101a (i.e., a hafnium silicate) that has been oxidized by the UV light irradiation is dissolved in the aqueous hydrogen fluoride solution, whereby the hafnium silicate outside the gate electrode 104 is eventually removed so that the substrate 100, i.e., the silicon region, is exposed.

Moreover, in the first embodiment, the hafnium silicon oxide film 101a, which is the lower-layer portion of the gate insulating film, is removed by the UV light irradiation and the hydrogen fluoride treatment after removing the hafnium oxide film 101b, which is the upper-layer portion of the gate insulating film. Alternatively, the hafnium oxide film 101b may be removed by the UV light irradiation and the hydrogen fluoride treatment. That is, it may not be necessary to wait for the hafnium silicon oxide film 101a to be exposed before performing the UV light irradiation and the hydrogen fluoride treatment to remove the hafnium silicon oxide film 101a. In other words, the UV light irradiation and the hydrogen fluoride treatment may be initiated to remove the hafnium oxide film 101b when the polysilicon film 102 is removed and the hafnium oxide film 101b is exposed. This is because the hafnium oxide film 101b can of course be removed by the UV light irradiation and the hydrogen fluoride treatment. Note that where the hafnium oxide film 101b has been crystallized through a high-temperature heat treatment, or the like, it is preferred to use an aqueous hydrogen fluoride solution having a concentration (by volume) of about 10% and a temperature of about 70° C. for removing the hafnium oxide film 101b.

Moreover, in the first embodiment, an aqueous hydrogen fluoride solution as an etchant is supplied in an ordinary liquid state when etching away the hafnium silicon oxide film 101a after the UV light irradiation. Alternatively, hydrogen fluoride may be supplied in a gaseous state. That is, an anhydrous hydrogen fluoride vapor may be used. Moreover, other than an aqueous hydrogen fluoride solution, the etchant may be another liquid containing fluorine and hydrogen, a phosphoric acid solution, or the like.

Moreover, while an etching object is irradiated with ultraviolet light in an oxygen-containing atmosphere in the first embodiment, similar effects can be obtained by irradiating the etching object with ultraviolet light while an oxygen-containing liquid (e.g., water) is attached to the surface of the etching object.

Moreover, while the present invention is applied to the removal of a silicate compound on the surface side of a wafer in the first embodiment, the present invention may alternatively be applied to the removal of a silicate compound on the reverse side of a wafer. In such a case, it is possible to prevent the cross-contamination between wafers being processed.

Variation of First Embodiment

A method for manufacturing a semiconductor device according to a variation of the first embodiment of the present invention will now be described with reference to the drawings.

The present variation differs from the first embodiment only in the method for removing a hafnium silicon oxide film by wet etching using an aqueous hydrogen fluoride solution (see FIG. 1(d)). Specifically, in the first embodiment, the hafnium silicon oxide film is oxidized by using the ozone generated by the UV light radiation (radiation of the xenon excimer light 203) before performing the hydrogen fluoride treatment on the insufficiently-oxidized hafnium silicon oxide film. In contrast, in the present variation, a hafnium silicon oxide film (hafnium silicate) is oxidized by using ozone water before performing the hydrogen fluoride treatment on an insufficiently-oxidized hafnium silicon oxide film.

Figure 3:
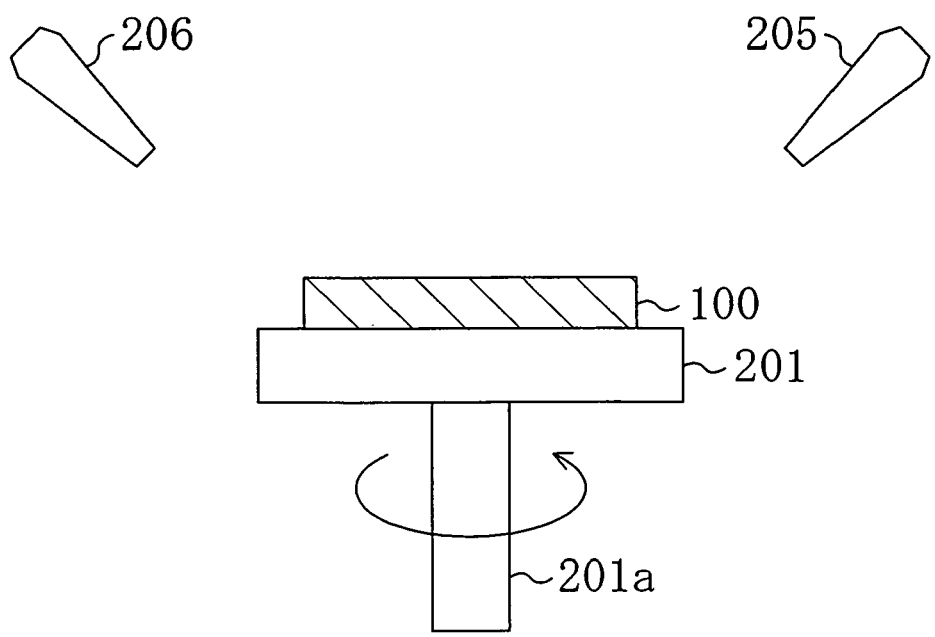
FIG. 3 is a schematic diagram illustrating a configuration of an etching apparatus according to a variation of the first embodiment of the present invention.

FIG. 3 is a schematic diagram illustrating a configuration of an etching apparatus according to the present variation.

As illustrated in FIG. 3, the substrate 100 is placed on a substrate table 201. Note that the hafnium silicon oxide film 101a, or the like, being an etching object on the substrate 100 is not shown in the figure. The rotating shaft (rotating mechanism) 201a for spinning the substrate table 201 is attached to the lower surface of the substrate table 201, whereby the substrate 100 can be spun together with the substrate table 201. Moreover, the etching apparatus of the present variation includes the chemical liquid supply section 205 capable of supplying an etchant (chemical liquid) onto the substrate 100 on the substrate table 201, and also includes an ozone water supply section 206 capable of supplying ozone water onto the substrate 100. Note that the wet etching apparatus of the present variation is an apparatus of a so-called "single wafer process" type that processes one wafer to be the substrate 100 at a time.

In the present variation, first, ozone water is supplied from the ozone water supply section 206 onto the substrate 100 while spinning the substrate 100 together with the substrate table 201 by the rotating shaft 201a, by using the etching apparatus illustrated in FIG. 3. In this way, the insufficiently-oxidized hafnium silicate (the hafnium silicon oxide film 101a) on the substrate 100 is oxidized.

Next, the substrate 100 is spun by using the rotating shaft 201a to shake the ozone water off the substrate 100. Then, an aqueous hydrogen fluoride solution, for example, is supplied from the chemical liquid supply section 205 toward the substrate 100, again while spinning the substrate 100. In this way, a portion of the insufficiently-oxidized hafnium silicate, which is normally insoluble in an aqueous hydrogen fluoride solution, that has been oxidized by the ozone water treatment takes a stoichiometric composition close to that of hafnium oxide, whereby the portion is reliably dissolved in the aqueous hydrogen fluoride solution. Thus, a portion of the hafnium silicon oxide film 101a outside the gate electrode 104 is reliably removed by wet etching.

Note that in a case where the hafnium silicate film has such a large thickness that the film cannot entirely be removed by a single iteration of the ozone water treatment and the hydrogen fluoride treatment, the set of processes including the ozone water treatment and the hydrogen fluoride treatment is repeated for the film. Specifically, the hafnium silicate on the substrate is oxidized by the ozone water treatment, and then the oxidized hafnium silicate is removed by the hydrogen fluoride treatment. Then, after hydrogen fluoride remaining on the substrate is washed away with pure water, the surface condition of the substrate is measured by, for example, confirming the water repellency of the substrate. If it is confirmed that the surface of the substrate (silicon substrate) is not exposed, the second set of the ozone water treatment and the hydrogen fluoride treatment is performed for the hafnium silicate remaining on the substrate, thus removing the newly-oxidized hafnium silicate. Then, after hydrogen fluoride remaining on the substrate is washed away with pure water, the surface condition (water repellency) of the substrate is confirmed again. Thus, the set of processes is repeated until it is confirmed by the measurement that the substrate surface is exposed. In such a case, in order to improve the throughput in the manufacture of a semiconductor device, it is preferred that the washing with pure water and the measurement of the substrate surface condition can be performed in the same apparatus that performs the ozone water treatment and the hydrogen fluoride treatment (e.g., the etching apparatus illustrated in FIG. 3).

As described above, according to the present variation, the process of etching the gate insulating film having the hafnium silicon oxide film (silicate layer) 101a is performed by oxidizing the insufficiently-oxidized hafnium silicon oxide film 101, and then wet-etching the oxidized hafnium silicon oxide film 101a. In this process, the composition of the oxidized hafnium silicon oxide film 101a comes closer to the stoichiometric composition of hafnium oxide. Thus, the oxidized hafnium silicon oxide film 101a becomes more soluble in an etchant such as an aqueous hydrogen fluoride solution, for example. Therefore, it is possible to reliably remove the oxidized hafnium silicon oxide film 101a by wet etching, and to prevent a situation where impurities remain between gate electrode structures, thereby improving the production yield in the manufacture of a semiconductor device.

Moreover, according to the present variation, an aqueous hydrogen fluoride solution that does not substantially etch the substrate (silicon substrate) 100 underlying the gate insulating film is used as the etchant, whereby the oxidized hafnium silicon oxide film 101a can be removed selectively by wet etching, and the etching can be stopped at the surface of the substrate 100. Thus, the surface of the substrate 100 (a portion outside the gate electrode 104) can be exposed without etching the surface of the substrate 100.

Moreover, according to the present variation, ozone water is supplied from the ozone water supply section 206 onto the substrate 100 by using the etching apparatus illustrated in FIG. 3. Therefore, the hafnium silicon oxide film 101a on the substrate 100 can reliably be oxidized by the ozone water.

Note that when ozone water is supplied from the ozone water supply section 206 onto the substrate 100 in the present variation, the substrate 100 may be irradiated with UV light by using an ultraviolet light source, e.g., the excimer lamp 202 in the etching apparatus of the first embodiment illustrated in FIG. 2.

Moreover, in the present variation, the hafnium silicon oxide film 101a, which is the lower-layer portion of the gate insulating film, is removed by the ozone water treatment and the hydrogen fluoride treatment after removing the hafnium oxide film 101b, which is the upper-layer portion of the gate insulating film. Alternatively, the hafnium oxide film 101b may be removed by the ozone water treatment and the hydrogen fluoride treatment. That is, it may not be necessary to wait for the hafnium silicon oxide film 101a to be exposed before performing the ozone water treatment and the hydrogen fluoride treatment to remove the hafnium silicon oxide film 101a. In other words, the ozone water treatment and the hydrogen fluoride treatment may be initiated to remove the hafnium oxide film 101b when the polysilicon film 102 is removed and the hafnium oxide film 101b is exposed. This is because the hafnium oxide film 101b can of course be removed by the ozone water treatment and the hydrogen fluoride treatment. Note that where the hafnium oxide film 101b has been crystallized through a high-temperature heat treatment, or the like, it is preferred to use an aqueous hydrogen fluoride solution having a concentration (by volume) of about 10% and a temperature of about 70° C. for removing the hafnium oxide film 101b.

Moreover, in the present variation, an aqueous hydrogen fluoride solution as an etchant is supplied in an ordinary liquid state when etching away the hafnium silicon oxide film 101a after the ozone water treatment. Alternatively, hydrogen fluoride may be supplied in a gaseous state. That is, an anhydrous hydrogen fluoride vapor may be used. Moreover, other than an aqueous hydrogen fluoride solution, the etchant may be another liquid containing fluorine and hydrogen, a phosphoric acid solution, or the like. Moreover, while ozone water is used for oxidizing the hafnium silicon oxide film 101a, another ozone-containing liquid may alternatively be used.

Moreover, the present invention is applied to the removal of a silicate compound on the surface side of a wafer in the present variation. Alternatively, the present invention may be applied to the removal of a silicate compound on the reverse side of a wafer. In such a case, it is possible to prevent the cross-contamination between wafers being processed.

Evaluation of First Embodiment and Variation Thereof

The results of the experimental evaluation of the first embodiment and the variation thereof will now be described.

The present inventor removed a hafnium silicate in the following three process methods in order to evaluate the first embodiment and the variation thereof.

(1) Combination of the UV light irradiation in an oxygen-containing atmosphere and the hydrogen fluoride treatment (corresponding to the first embodiment; hereinafter referred to as the "UV/DHF process")

(2) Combination of the ozone water treatment and the hydrogen fluoride treatment (corresponding to the variation of the first embodiment; hereinafter referred to as the "$O_3$/DHF process")

(3) The hydrogen fluoride treatment alone (comparative example; hereinafter referred to as the "DHF process")

Specifically, each of processes (1) to (3) was regarded as one cycle and repeated to wet-etch the hafnium silicate. Note that for the DHF process (process (3)), the DHF process alone constitutes one cycle.

Moreover, the detailed conditions of processes (1) to (3) are as follows.

(1) The UV light irradiation was performed for 60 seconds using xenon excimer light, and a treatment with an aqueous hydrogen fluoride solution having a concentration (by volume; concentration hereinafter refers to a concentration by volume) of 2.5% was performed for 30 seconds.

(2) The ozone water treatment (ozone washing) was performed for 60 seconds, and a treatment with an aqueous hydrogen fluoride solution having a concentration of 2.5% was performed for 30 seconds.

(3) A treatment with an aqueous hydrogen fluoride solution having a concentration of 2.5% was performed for 30 seconds.

As hafnium silicate on a silicon substrate was removed under the conditions above, the silicon substrate was exposed and the water repellency was confirmed in the fourth cycle for the UV/DHF process (process (1)) and the $O_3$/DHF process (process (2)). On the other hand, the water repellency was not confirmed when the DHF process (process (3)) alone was performed.

Thus, a hafnium silicate ($HfSi_xO_y$: x>0, y>0) present on the substrate surface cannot be etched substantially by the DHF process alone. In contrast, oxidizing the hafnium silicate by the UV light irradiation or the ozone water treatment facilitates the etching of the hafnium silicate by the hydrogen fluoride treatment. The reason for this was believed to be as follows based on XPS (X-ray Photoelectron Spectroscopy).

Figures 4, 5:
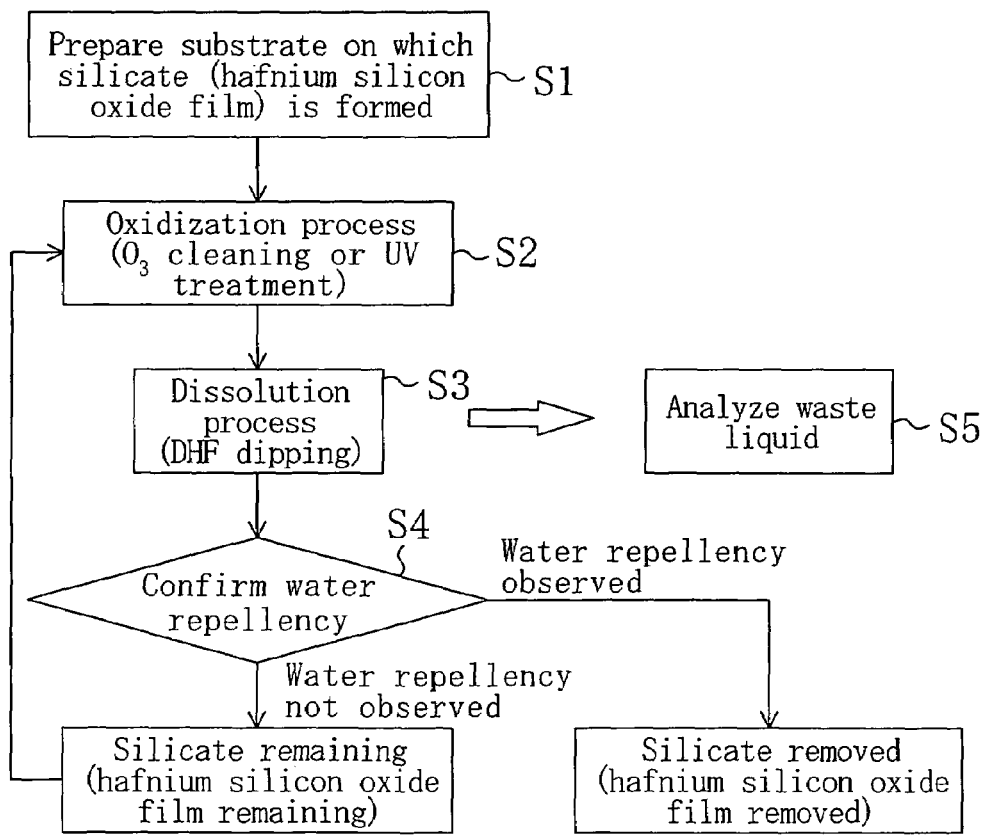
FIG. 4 shows the results of XPS performed by the present inventor on the state of chemical bond on the surface of each sample (hafnium silicate) prepared through a different process.
FIG. 5 is a flow chart illustrating a compound analysis method according to the second embodiment of the present invention.

FIG. 4 shows the results of XPS on the state of chemical bond on the surface of each sample (hafnium silicate) prepared through a different process, specifically, the results obtained from Hf (hafnium) 4f XPS spectra. Generally, with XPS, it is possible to know the state of chemical bond (the state of oxidation in the present invention) based on the amount of shift in the 4f 7/2 peak.

In FIG. 4, the result "a" is based on an Hf 4f (the right peak: 4f 7/2, the left peak: 4f 5/2) XPS spectrum obtained by measuring the surface of a hafnium silicate layer having a thickness of 3.5 nm deposited by a CVD method (deposition temperature: 450° C.) in an unprocessed state. Moreover, the result "b" is based on an Hf 4f XPS spectrum obtained by measuring the surface of the same hafnium silicate layer but after performing the UV light irradiation for 60 seconds. Moreover, the result "c" is based on an Hf 4f XPS spectrum obtained by measuring the surface of the same hafnium silicate layer but after performing the ozone water treatment for 60 seconds. Furthermore, the result "d" is based on an Hf 4f XPS spectrum obtained by measuring the surface of the same hafnium silicate layer but after treating the layer with an aqueous hydrogen fluoride solution having a concentration of 2.5% for 30 seconds.

As illustrated in FIG. 4, the result "b" (UV light irradiation) and the result "c" (ozone water treatment) give higher XPS spectrum values than those of the result "a" (unprocessed) and the result "d" (2.5% DHF process). This indicates more advanced states of oxidation of Hf atoms for the result "b" (UV light irradiation) and the result "c" (ozone water treatment). Thus, it was confirmed that the insufficiently-oxidized hafnium silicate was oxidized by the UV light irradiation or the ozone water treatment. Therefore, as described above in the first embodiment and the variation thereof, etching of an insufficiently-oxidized hafnium silicate, which is normally insoluble in an aqueous hydrogen fluoride solution, is facilitated by performing the hydrogen fluoride treatment in combination with the UV light irradiation or the ozone water treatment.

Second Embodiment

A compound analysis method according to the second embodiment of the present invention, specifically, a method for analyzing a silicate compound that is formed on the substrate surface when a hafnium oxide film is used as the gate insulating film. Note that in the compound analysis method of the present embodiment, the silicate compound is dissolved and removed by using the etching method of the first embodiment or the variation thereof, while the used etchant (chemical liquid) is collected, and the composition of the collected chemical liquid is analyzed. A quantitative analysis such as a high-frequency inductively-coupled plasma mass analysis, for example, is performed as the compositional analysis of the chemical liquid.

FIG. 5 is a flow chart illustrating the compound analysis method according to the second embodiment.

First, in step S1, a substrate on which a silicate (e.g., the hafnium silicon oxide film) is formed is prepared. FIG. 6 illustrates an example of a cross section of such a substrate. Specifically, an insufficiently-oxidized hafnium silicon oxide film 151 is formed on a substrate 150 made of silicon, for example, as illustrated in FIG. 6. Alternatively, a substrate having a cross section as illustrated in FIG. 1(c) of the first embodiment may be prepared.

Then, in step S2, the insufficiently-oxidized hafnium silicon oxide film 151 is oxidized by using the UV light irradiation of the first embodiment or the ozone water treatment of the variation of the first embodiment. Then, in step S3, the oxidized hafnium silicon oxide film 151 is removed by wet etching using a hydrogen fluoride (DHF) solution.

Then, in step S4, it is confirmed whether or not the surface of the substrate 150 exhibits water repellency. If the surface of the substrate 150 exhibits water repellency, it is determined that the surface of the substrate 150 is exposed, and the etching process is stopped. Specifically, the UV light irradiation or the ozone water treatment and the following hydrogen fluoride treatment are stopped. On the other hand, if the surface of the substrate 150 does not exhibit water repellency, it is determined that the surface of the substrate 150 is not yet exposed, and the etching process is continued. Specifically, the process goes back to step S2 to again perform the set of processes including the UV light irradiation or the ozone water treatment and the hydrogen fluoride treatment.

As described above, in the present embodiment, the set of processes described above is repeated until the surface of the substrate 150 is exposed, and the used chemical liquid (hereinafter referred to as the "waste liquid") is collected. Specifically, where the etching method of the first embodiment is used, the waste liquid produced by successively performing the UV light irradiation and the hydrogen fluoride treatment is collected. Where the etching method of the variation of the first embodiment is used, the waste liquid produced by successively performing the ozone water treatment and the hydrogen fluoride treatment is collected. In such a case, the ozone water may be collected together with the aqueous hydrogen fluoride solution, or the aqueous hydrogen fluoride solution alone may be collected.

Finally, in step S5, a mass analysis of the collected waste liquid is performed by using a high-frequency inductively-coupled plasma mass analyzer, for example. In this way, it is possible to identify the impurities contained in the hafnium silicon oxide film 151.

Thus, according to the second embodiment, the etching method of the first embodiment or the variation thereof is performed on the hafnium silicon oxide film 151, after which the waste liquid is collected and analyzed. Therefore, it is possible to reliably remove the insufficiently-oxidized hafnium silicon oxide film 151, which is difficult to remove by a conventional wet etching process, and it is possible to easily identify the impurities contained in the hafnium silicon oxide film 151 simply by analyzing the collected waste liquid (by a compositional analysis such as a mass analysis). Note that an insufficiently-oxidized silicate compound such as a hafnium silicon oxide film is conventionally analyzed by dissolving a silicate compound in a phosphoric acid or a fluoronitric acid (a mixed solution of hydrogen fluoride and nitric acid), and then collecting and analyzing the chemical liquid. However, this method has the following two problems. That is, where a silicate compound is formed on a silicon substrate, significant dissolution of the substrate by a phosphoric acid, a fluoronitric acid, or the like, is inevitable. Moreover, performing a mass analysis, or the like, on such a chemical liquid lowers the precision of the quantitative analysis. Therefore, the compound analysis method of the present embodiment using the etching method of the first embodiment or the variation thereof is very useful.

Variation of Second Embodiment

A compound analysis method according to the variation of the second embodiment of the present invention, specifically, a method for analyzing a silicate compound that is formed on the substrate surface when a hafnium oxide film is used as the gate insulating film. Note that also in the compound analysis method of the present variation, the insufficiently-oxidized silicate compound is dissolved and removed by using the etching method of the first embodiment or the variation thereof, while the used etchant (chemical liquid) is collected, and the composition of the collected chemical liquid is analyzed. A quantitative analysis such as a high-frequency inductively-coupled plasma mass analysis, for example, is performed as the compositional analysis of the chemical liquid.

The present variation differs from the second embodiment as follows. In the second embodiment, a hafnium silicon oxide film is dissolved in an aqueous hydrogen fluoride solution, and the composition of the solution is analyzed so as to directly identify the impurities in the hafnium silicon oxide film. In contrast, in the present variation, the impurities in a layered film of the hafnium silicon oxide film and the hafnium oxide film are identified while the impurities in the hafnium oxide film are identified, and the identification results are compared with each other, thereby indirectly identifying the impurities in the hafnium silicon oxide film.

Specifically, in the present variation, a first silicon substrate and a second silicon substrate are prepared. A layered film (first layered film) of a hafnium silicon oxide film (lower-layer film) and a hafnium oxide film (upper-layer film) is formed on the first silicon substrate, and a second layered film having the same structure as that of the first layered film is formed on the second silicon substrate. The first and second silicon substrates are formed simultaneously in the same step. FIG. 7 illustrates an example of a cross section of the first and second silicon substrates. As illustrated in FIG. 7, an insufficiently-oxidized hafnium silicon oxide film 161 is formed on a substrate 160, and a hafnium oxide film 162 is formed on the hafnium silicon oxide film 161.

Then, the UV light irradiation of the first embodiment or the ozone water treatment of the variation of the first embodiment and the following hydrogen fluoride treatment are performed on the first silicon substrate to dissolve the hafnium silicon oxide film 161 and the hafnium oxide film 162 in an aqueous hydrogen fluoride solution, and the aqueous hydrogen fluoride solution is collected and subjected to a mass analysis. In this way, the impurities contained in the first layered film including the hafnium silicon oxide film 161 and the hafnium oxide film 162 are identified. "HfO$_2$-1" in FIG. 8 shows the detected amount of each impurity thus identified. It can be seen from the data shown in "HfO$_2$-1" in FIG. 8 that the first layered film contains sodium (Na), iron (Fe), etc., in addition to hafnium. Note that the etching process for the hafnium silicon oxide film 161 in the first layered film is similar to steps S2 to S4 (the etching process for the hafnium silicon oxide film 151) of the second embodiment illustrated in FIG. 5.

Then, the hydrogen fluoride treatment, i.e., wet etching using an aqueous hydrogen fluoride solution, is performed on the second silicon substrate having formed thereon the second layered film, which is similar in structure to the first layered film. In this process, the insufficiently-oxidized hafnium oxide film 162 in the second layered film is dissolved in the aqueous hydrogen fluoride solution, while the hafnium silicon oxide film 161 in the second layered film is not dissolved therein. Therefore, the impurities contained in the hafnium oxide film 162 are identified by collecting the waste liquid produced in the hydrogen fluoride treatment and analyzing the collected waste liquid by using a mass analyzer, for example. "HfO$_2$-2" in FIG. 8 shows the detected amount of each impurity thus identified. It can be seen from the data shown in "HfO$_2$-2" in FIG. 8 that the hafnium oxide film 162 in the second layered film contains sodium (Na), etc., in addition to hafnium.

Finally, the data shown in "HfO$_2$-1" and the data shown in "HfO$_2$-2" in FIG. 8 are compared with each other, thereby indirectly identifying the impurities contained in the hafnium silicon oxide film 161.

Note that the first embodiment or the variation thereof or the second embodiment or the variation thereof has been described with respect to the etching of a hafnium silicate (hafnium silicon oxide film). However, the present invention is not limited to this, and similar effects can be obtained also when the present invention is applied to the etching of a zirconium silicate (ZrSi$_x$O$_y$: x>0, y>0), for example. Specifically, similar effects can be obtained when the present invention is applied to the etching of a silicate compound containing at least one of Hf, Zr, Al, Ti, V, Co, Ni, Cu, Ga, Sr, Y, Nb, Mo, Ru, Pd, La, Ta, W, Ir, Pr, Nd, etc. Moreover, similar effects can be obtained when the present invention is applied to the etching of an intermetallic compound (specifically, a compound between silicon and a metal, e.g., cobalt silicide (CoSi)) containing at least one of Hf, Zr, Al, Ti, V, Co, Ni, Cu, Ga, Sr, Y, Nb, Mo, Ru, Pd, La, Ta, W, Ir, Pr, Nd, etc., instead of a silicate compound.

The invention claimed is:

1. An etching method, comprising:
    a first step of oxidizing an incompletely oxidized compound containing at least a metal and silicon and formed on a surface of a substrate; and
    a second step of removing the oxidized compound by wet etching,
    wherein the first step includes a step of irradiating the compound with ultraviolet light in an oxygen-containing atmosphere such that the compound is completely oxidized.

2. The etching method of claim 1, wherein the metal is hafnium or zirconium.

3. The etching method of claim 1, wherein the compound is a silicate compound.

4. The etching method of claim 1, wherein the compound is an intermetallic compound.

5. The etching method of claim 1, wherein the ultraviolet light irradiation is performed while supplying a nitrogen gas into the atmosphere.

6. An etching method comprising:
    a first step of oxidizing an incompletely oxidized compound containing at least a metal and silicon and formed on a surface of a substrate; and
    a second step of removing the oxidized compound by wet etching,
    wherein the first step occurs while an ozone-containing liquid is supplied to a surface of the compound.

7. The etching method of claim 6, wherein the first step includes a step of irradiating the compound with ultraviolet light while the ozone-containing liquid is supplied to a surface of the compound.

8. The etching method of claim 1, wherein a solution containing fluorine and hydrogen is used as an etchant in the second step.

9. The etching method of claim 8, wherein the solution is supplied by spraying as a wet etchant onto the substrate.

10. The etching method of claim 6, wherein:
    the metal is hafnium or zirconium.

11. A method for manufacturing a semiconductor device, comprising:
    a step of forming a gate insulating film on a silicon region;
    a step of forming a conductive film on the gate insulating film;
    a step of forming a gate electrode by dry-etching the conductive film using a mask that covers a gate electrode formation region; and
    a step of removing a portion of the gate insulating film outside the gate electrode by wet etching, wherein:
    the gate insulating film includes an insulating layer comprising a compound containing a metal, silicon and oxygen; and
    the step of removing the gate insulating film includes a step of oxidizing the insulating layer in an ozone-containing atmosphere or by an ozone-containing solution such that the insulating layer is completely oxidized, and removing the oxidized insulating layer by wet etching.

12. The method for manufacturing a semiconductor device of claim 11, wherein:
    the metal is hafnium or zirconium; and
    a solution containing fluorine and hydrogen is used as an etchant in the step of removing the insulating layer.

13. The method for manufacturing a semiconductor device of claim 11, wherein:

the gate insulating film further comprises an oxide film of the same kind of metal as the metal of the insulating layer; and the method further comprises a step of removing a portion of the oxide film outside the gate electrode by wet etching, before the step of oxidizing the insulating layer.

14. The etching method of claim 1, wherein:

the first step and the second step are performed simultaneously.

15. The etching method of claim 14, wherein a set of steps including the first step and the second step is performed repeatedly.

16. An etching method comprising:

a first step of oxidizing an incompletely oxidized compound containing at least a metal and silicon and formed on a surface of a substrate; and a second step of removing the oxidized compound by wet etching, wherein the first step occurs in an ozone-containing atmosphere.

17. The etching method of claim 6, wherein a solution containing fluorine and hydrogen is used as an etchant in the second step.

18. The etching method of claim 16, wherein a solution containing fluorine and hydrogen is used as an etchant in the second step.

19. The etching method of claim 6, wherein the first step and the second step are performed simultaneously.

* * * * *

UNITED STATES PATENT AND TRADEMARK OFFICE
CERTIFICATE OF CORRECTION

PATENT NO.        : 7,165,560 B2                                               Page 1 of 1
APPLICATION NO. : 10/490049
DATED             : January 23, 2007
INVENTOR(S)       : Shinji Fujii It is certified that error appears in the above-identified patent and that said Letters Patent is hereby corrected as shown below:

On the title page 2;

Item (56) Reference Cited, FOREIGN PATENT DOCUMENT, delete "WO 2004/075277 A1  9/2004"

Signed and Sealed this

Fifth Day of June, 2007

JON W. DUDAS
*Director of the United States Patent and Trademark Office*